(12) United States Patent
Wada

(10) Patent No.: US 7,167,769 B2
(45) Date of Patent: Jan. 23, 2007

(54) INLINE CONNECTION SETTING METHOD AND DEVICE AND SUBSTRATE PROCESSING DEVICES AND SUBSTRATE PROCESSING SYSTEM

(75) Inventor: Shigeki Wada, Kumamoto (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/546,385

(22) PCT Filed: Mar. 1, 2004

(86) PCT No.: PCT/JP2004/002497

§ 371 (c)(1),
(2), (4) Date: Aug. 18, 2005

(87) PCT Pub. No.: WO2004/086469

PCT Pub. Date: Oct. 7, 2004

(65) Prior Publication Data

US 2006/0079985 A1 Apr. 13, 2006

(30) Foreign Application Priority Data

Mar. 4, 2003 (JP) .............................. 2003-056572

(51) Int. Cl.
G06F 19/00 (2006.01)
(52) U.S. Cl. .................................... 700/121
(58) Field of Classification Search .................... 700/8, 700/117–121; 709/220–222; 719/321–327
See application file for complete search history.

(56) References Cited

U.S. PATENT DOCUMENTS

| | | | |
|---|---|---|---|
| 6,286,041 B1 * | 9/2001 | Collins et al. ............... | 709/221 |
| 6,493,594 B1 * | 12/2002 | Kraml ......................... | 700/19 |
| 6,988,193 B1 * | 1/2006 | French et al. .................. | 713/2 |
| 2001/0053291 A1 | 12/2001 | Fujita ........................... | 396/564 |
| 2002/0011207 A1 | 1/2002 | Uzawa et al. ................ | 118/666 |
| 2002/0124245 A1 * | 9/2002 | Maddux et al. ............. | 717/176 |
| 2003/0088651 A1 * | 5/2003 | Wilson ....................... | 709/221 |
| 2004/0049511 A1 * | 3/2004 | Yu .............................. | 707/100 |
| 2004/0123305 A1 * | 6/2004 | Kim et al. ................... | 719/321 |
| 2004/0128676 A1 * | 7/2004 | Wang et al. ................. | 719/321 |
| 2006/0101456 A1 * | 5/2006 | Crosier et al. .............. | 717/174 |

FOREIGN PATENT DOCUMENTS

| | | |
|---|---|---|
| JP | 05-020332 | 1/1993 |
| JP | 05-062873 | 3/1993 |
| JP | 10-125587 | 5/1998 |
| JP | 11-145979 | 5/1999 |
| JP | 11-176723 | 7/1999 |
| JP | 2000-188253 | 7/2000 |
| JP | 2001-023875 | 1/2001 |
| JP | 2002-057100 | 2/2002 |
| JP | 2002-075853 | 3/2002 |

* cited by examiner

Primary Examiner—Maria N. Von Buhr
(74) Attorney, Agent, or Firm—Smith, Gambrell & Russell, LLP

(57) ABSTRACT

It at least includes a step at which a coating and developing apparatus requests an exposure apparatus, connected inline thereto, to transfer profile information which is information relating to the exposure apparatus, a step at which the coating and developing apparatus receives the profile information from the exposure apparatus, and a step at which the coating and developing apparatus selects a software file to be used in the coating and developing apparatus, in association with the profile information.

33 Claims, 8 Drawing Sheets

| TYPE CODE | MAKER NAME | MODEL | SOFTWARE Ver. |
|---|---|---|---|
| 00 | COMPANY A(001) | 1 | Ver.1.0 |
| 01 | COMPANY A(001) | 1 | Ver.2.0 |
| 02 | COMPANY A(001) | 2 | Ver.1.0 |
| 03 | COMPANY B(012) | 1 | Ver.1.0 |
| 04 | COMPANY B(012) | 2 | Ver.1.0 |
| 05 | COMPANY B(012) | 2 | Ver.2.0 |
| ⋮ | ⋮ | ⋮ | ⋮ |
| FE | — | — | — |
| FF | — | — | — |

EXAMPLE OF PIN ASSIGNMENT OF APPARATUS OF MAKER A

| CONNECTOR PIN | SIGNAL NAME | FUNCTION |
|---|---|---|
| 1 | UNUSED | UNUSED PIN |
| 2 | Send | WAFER BEING TRANSFERRED |
| 3 | Error | ERROR |
| 4 | Lend | LOT END |
| ⋮ | ⋮ | ⋮ |
| 8 | UNUSED | UNUSED PIN |

FIG.8A

EXAMPLE OF PIN ASSIGNMENT OF APPARATUS OF MAKER B

| CONNECTOR PIN | SIGNAL NAME | FUNCTION |
|---|---|---|
| 1 | UNUSED | UNUSED PIN |
| 2 | Send | WAFER BEING TRANSFERRED |
| 3 | Error | LOT END |
| 4 | Cassette end | CASSETTED END |
| ⋮ | ⋮ | ⋮ |
| 8 | Process End | PROCESS TERMINATED |

FIG.8B

INLINE CONNECTION SETTING METHOD AND DEVICE AND SUBSTRATE PROCESSING DEVICES AND SUBSTRATE PROCESSING SYSTEM

TECHNICAL FIELD

The present invention relates to an inline connection setting method and apparatus, which automatically set connection between apparatuses that perform an inline process, and a substrate processing technology, and relates to an inline connection setting method and apparatus which regularly checks a connected apparatus, for example, at the time activation starts (at the time of power ON) or during activation, and automatically set connection of the inline-connected apparatus every such an occasion.

BACKGROUND ART

In a photolithography process in an electronic device fabrication process for, for example, a semiconductor, a liquid crystal display or the like, a coating and developing apparatus which performs coating and developing of a resist liquid on a wafer or a glass substrate, and an exposure apparatus which performs an exposure process on the wafer or glass substrate coated with the resist liquid are combined, and an inline process is carried out.

The coating and developing apparatus, the exposure apparatus and the inline process are disclosed in Unexamined Japanese Patent Application KOKAI Publication No. 2000-188253.

The inline process at the field of device fabrication is often carried out in a multi-vender environment where apparatuses of different makers are connected inline to each other.

In an environment where an exposure apparatus of a maker A and an exposure apparatus of a maker B are connectable to a coating and developing apparatus, for example, depending on the makers of the exposure apparatuses, the communication timings thereof differ, disabling a smooth operation; for example, a Send signal is set to an ON state before the coating and developing apparatus performs wafer transfer (the Send signal becomes an ON state, then a wafer is transferred) in communication between the exposure apparatus of the maker A and the coating and developing apparatus, whereas the Send signal is set to an ON state after wafer transfer (the Send signal becomes an ON state when transfer of a wafer is finished) in communication between the exposure apparatus of the maker B and the coating and developing apparatus.

In general, assignment of connector pins of a communication cable differs depending on the makers. For instance, the specification, such as assignment of a signal name, often differs even for the same pin number, like the connector pin of a specific pin number of the exposure apparatus of the maker A being assigned to an error signal while the connector pin of the same pin number of the exposure apparatus of the maker B is assigned to a lot end signal.

Accordingly, the maker of the coating and developing apparatus sets data of the coating and developing apparatus beforehand according to an apparatus to be connected at the destination of delivery before delivery of the coating and developing apparatus.

At the field of device fabrication, however, a connected partner apparatus, e.g., an exposure apparatus, may be changed to the one of another maker or the internal software of the exposure apparatus may be changed to a different specification. In this case, the coating and developing apparatus should reset the internal software according to a new exposure apparatus. In the resetting, conventionally, a changing work or input setting is carried out manually (manual operation) by an operator.

In case of coping with it through the manual operation by the operator, however, human mistakes are inevitable, and the inline process of the coating and developing apparatus and the exposure apparatus may not be executed smoothly, as in a case where, for example, necessary changes are not made to the software setting even if the exposure apparatus is changed, or erroneous setting occurs in changing the software setting.

In such a case where the inline process is not executed smoothly, for example, a wafer is broken and the rate of occurrence of defective products becomes higher, thus leading to a reduction in yield.

When a trouble, such as a failure, occurs in an inline-connected exposure apparatus, the coating and developing apparatus is set to a standby mode, is powered off or so by the manual operation of the operator.

However, there is a risk of performing an inadequate process such that the operator reactivates the coating and developing apparatus from the standby mode without recovery of the failure of the exposure apparatus.

DISCLOSURE OF INVENTION

It is therefore an object of the invention to provide an inline connection setting method and apparatus which can automatically perform a work of setting the internal software file corresponding to a connected partner apparatus when the main body of a partner apparatus to be connected inline or the internal software of the partner apparatus is altered, or can automatically take the adequate measures when a trouble occurs in the connected partner apparatus.

That is, according to the first aspect of the invention, there is provided an inline connection setting method for automatically setting connection between apparatuses which perform an inline process on an object to be processed, comprising steps of:

causing a first processing apparatus to request a second processing apparatus, connected inline to the first processing apparatus, to transfer profile information which is information relating to the second processing apparatus;

causing the first processing apparatus to receive the profile information from the second processing apparatus; and causing the first processing apparatus to select a software file to be used in the first processing apparatus, in association with the profile information.

According to such a method, information relating to a partner apparatus can be acquired by receiving profile information of the partner apparatus from the partner apparatus connected inline, so that an adequate software file for matching with the partner apparatus can be selected.

It is desirable that the first processing apparatus should receive the profile information by directly communicating with the second processing apparatus via a communication path formed in an LAN (Local Area Network).

Often is a case where an LAN has already been formed, and the use of such an LAN to secure a communication path can reduce the cost for the apparatus.

It is desirable that the profile information should include at least maker information and model information of the second processing apparatus, and version information of software file to be used in the first processing apparatus.

Because the operational conditions for the connected partner apparatus can be specified by such information, it is possible to set a software file corresponding to the conditions.

It is desirable that the profile information should include information on whether the second processing apparatus is in a normal state or not.

Apparently, it is possible to take the adequate measures by receiving information on whether the connected partner apparatus is normal or abnormal.

Further, it is desirable that the first processing apparatus is connected to the second processing apparatus in a 1-to-1 manner by a communication cable, and comprises plural types of hardware definition files which are information on assignment of connector pins of the communication cable, and select a hardware definition file to be used in the first processing apparatus from the plural types of hardware definition files in association with the profile information.

It is desirable that the first processing apparatus further comprises software for processing the object to be processed, and plural types of interface files, and select an interface file to be used in the first processing apparatus from the plural types of interface files in association with the selected hardware definition file.

With plural types of interface files prepared beforehand this way, it is possible to select and use an interface file corresponding to the hardware definition file.

It is desirable that the first processing apparatus requests the second processing apparatus to transfer the profile information every given time.

Accordingly, even when an abnormality occurs in the partner apparatus while processing an object to be processed, that information can be acquired, thus making it possible to take the adequate measures.

According to the second aspect of the invention, there is provided an inline connection setting apparatus for automatically setting connection of a second processing apparatus to a first processing apparatus which performs an inline process on an object to be processed, comprising:

first memory means having a connection-state checking section which checks connection for information communication with the second processing apparatus, connected inline to the first processing apparatus, an information acquisition section which requests the second processing apparatus to transfer profile information relating to the second processing apparatus and receives the profile information, and a file selecting section which selects a software file to be used in association with the profile information; and control means for executing a program stored in the first memory means.

It is desirable that the first processing apparatus is connected to the second processing apparatus, connected inline thereto, in a 1-to-1 manner by a communication cable, and the first memory means should store plural types of hardware definition files which are information on assignment of connector pins of the communication cable.

It is desirable that the file selecting section has a hardware-definition-file selecting section, and the hardware-definition-file selecting section should select a hardware definition file to be used from the plural types of hardware definition files.

It is desirable that the first memory means stores software for processing the object to be processed, the plural types of hardware definition files, and plural types of interface files.

With plural types of interface files prepared beforehand this way, it is possible to select and use an interface file corresponding to the hardware definition file.

It is desirable that the file selecting section has a hardware-definition-file selecting section and an interface-file selecting section, the hardware-definition-file selecting section should select a hardware definition file to be used from the plural types of hardware definition files, and the interface-file selecting section should select an interface file to be used from the plural types of interface files.

This structure can select a hardware definition file and an interface file stored in the first memory means.

It is desirable that the information acquisition section receives the profile information by directly communicating with the inline-connected second processing apparatus via a communication path formed in an LAN (Local Area Network).

Often is a case where an LAN has already been formed, and the use of such an LAN to secure a communication path can reduce the cost for the apparatus.

It is desirable that the profile information includes at least maker information and model information of the second processing apparatus, and version information of software file to be used in the first processing apparatus, and the inline connection setting apparatus should further comprise second memory means for storing the profile information received.

With preparation of a location where such profile information is received, as the operational conditions for the connected partner apparatus can be specified by referring to the information, it is possible to set a software file corresponding to the conditions.

It is desirable that the profile information includes information on whether the partner apparatus is in a normal state or not.

Apparently, it is possible to take the adequate measures by receiving information on whether the connected partner apparatus is normal or abnormal.

According to the third aspect of the invention, there is provided a substrate processing apparatus which performs an inline process on a substrate in cooperation with a partner apparatus, comprising:

a processing section which performs an inline process on the substrate;

a substrate transfer mechanism which transfers the substrate between the processing section and the partner apparatus;

a first communication interface which performs information communication with the partner apparatus for performing the inline process on the substrate;

a second communication interface which communicates software information with the partner apparatus;

information acquisition means which acquires profile information relating the partner apparatus from the partner apparatus via the second communication interface;

software-file memory means which stores a plurality of software files for controlling an operation of the substrate processing apparatus; and file selecting means which selects, from the software-file memory means, a software file for controlling the operation of the substrate processing apparatus.

According to this substrate processing apparatus, information relating to a partner substrate processing apparatus can be acquired by receiving profile information of that apparatus from the partner substrate processing apparatus connected inline, so that an adequate software file for matching with the partner substrate processing apparatus can be selected in an inline process where a series of processes are performed on a substrate in cooperation with the partner substrate processing apparatus.

According to the fourth aspect of the invention, there is provided a a substrate processing system comprising a first processing apparatus which performs an inline process on an object to be processed, and a second processing apparatus, wherein the first processing apparatus comprising a connection setting section having:

first memory means having a connection-state checking section which checks connection for information communication with the second processing apparatus, connected inline, an information acquisition section which requests the second processing apparatus to transfer profile information relating to the second processing apparatus and receives the profile information, and a file selecting section which selects a software file to be used in association with the profile information; and control means for executing a program stored in the first memory means.

According to this substrate processing system, a first processing apparatus and a second processing apparatus, connected inline, can acquire information relating to a partner processing apparatus by receiving profile information of that apparatus from the partner substrate processing apparatus, so that an adequate software file for matching with the partner processing apparatus can be selected in an inline process where a series of processes are performed on a substrate in cooperation with the partner processing apparatus.

BRIEF DESCRIPTION OF DRAWINGS

FIG. 7 is a diagram showing an example of a code table which is stored as data in the auxiliary memory section.

FIGS. 8A and 8B are diagrams respectively showing examples of assignment of connector pins in exposure apparatuses of a company A and a company B.

BEST MODE FOR CARRYING OUT THE INVENTION

An embodiment of the present invention will be described below with reference to the accompanying drawings.

Figure 1:
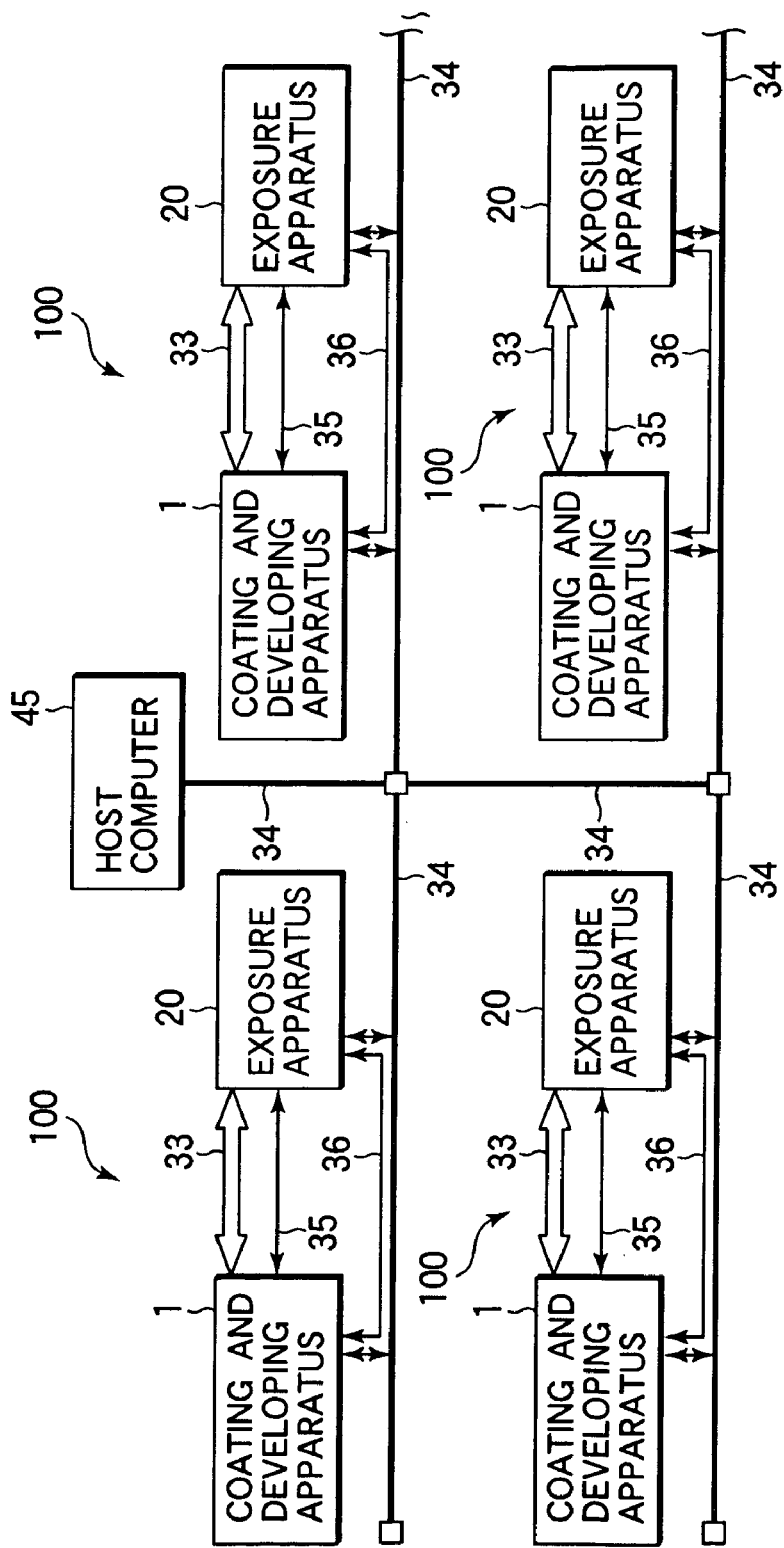
FIG. 1 is a block diagram illustrating the relationship between a plurality of pattern forming apparatuses and a host computer.

FIG. 1 is a block diagram illustrating the relationship between a plurality of pattern forming systems and a host computer, which are used in a photolithography process in a fabrication process for an electronic device, such as a semiconductor or a liquid crystal display.

Figure 2:
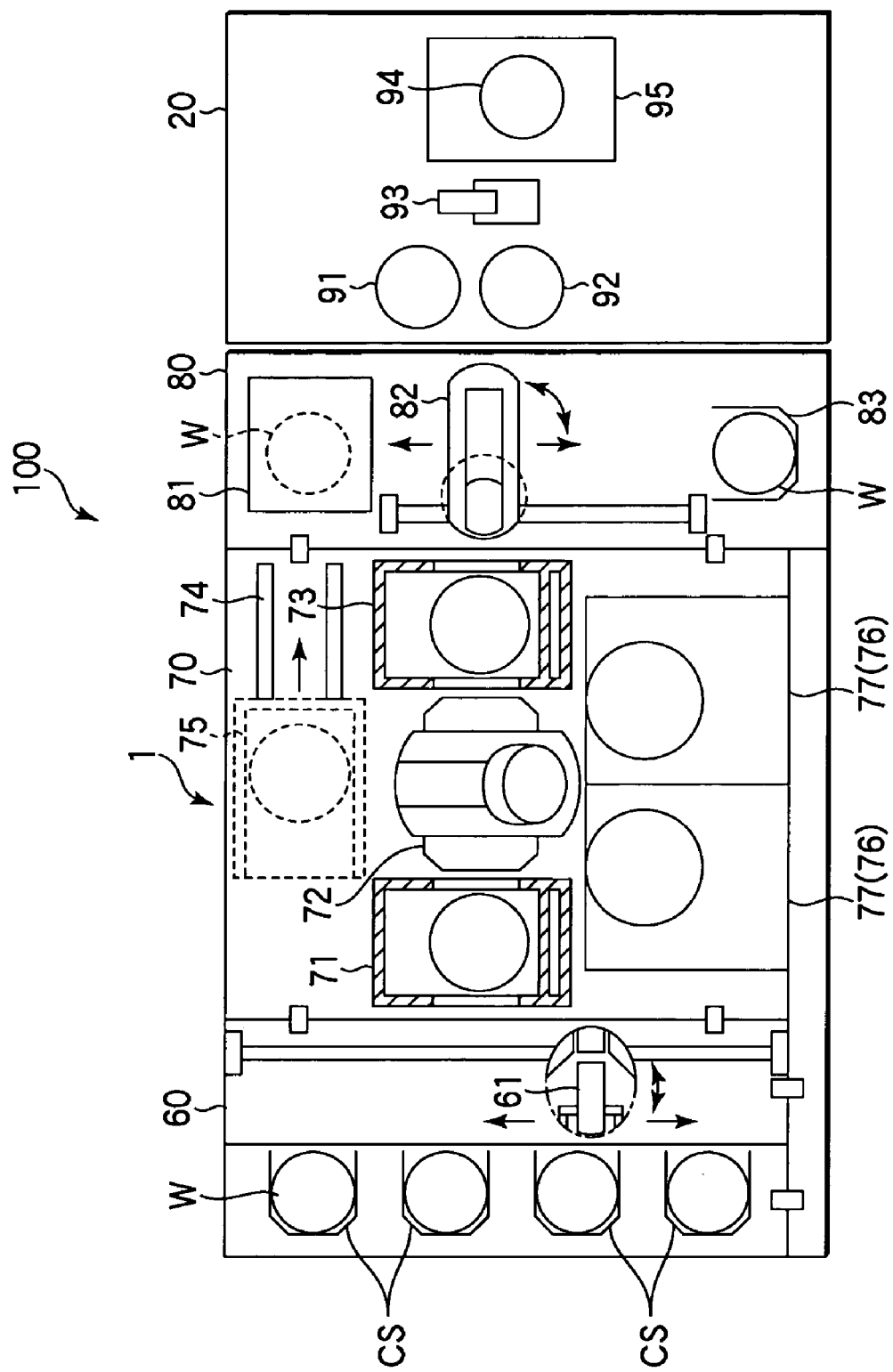
FIG. 2 is a plan view showing an example of the structure of a mechanism system of the pattern forming apparatus.

As shown in FIG. 1, a pattern forming system 100 has a coating and developing apparatus 1 and an exposure apparatus 20, which are arranged in such a way that transfer of a wafer (substrate) or an object to be processed is secured by a transfer line 33 (equivalent to an interface section 80 as shown in FIG. 2), and are connected to each other by a communication path 35.

A plurality of pattern forming systems 100 (four pattern forming apparatuses shown in FIG. 1) are respectively connected to LAN cables 34 that form an LAN (Local Area Network), such as Ethernet (registered trademark). Specifically, the coating and developing apparatus 1 and the exposure apparatus 20 are connected to the LAN cable 34 to which a host computer 45 is connected.

The host computer 45 performs the operational control of the plural pattern forming systems 100 via the LAN. For example, a process recipe to a wafer as an object to be processed is designated to, and a process start command is issued to, each pattern forming system 100.

As shown in FIG. 2, each pattern forming system 100 has the coating and developing apparatus 1 which performs resist coating on a wafer W and development after exposure, and the exposure apparatus 20 which exposes the resist coated on the wafer W, and the coating and developing apparatus 1 and the exposure apparatus 20 are connected inline.

The coating and developing apparatus 1 comprises a loading/unloading section 60 where a cassette CS retaining a plurality of wafers W are carried in and out, a coating and developing section 70 which coats a resist on a wafer W and performs development after exposure, and an interface section 80 which transfers a wafer W between the coating and developing section 70 and the exposure apparatus 20.

The loading/unloading section 60 has a transfer mechanism 61 which transfers a wafer W between the cassette CS and the coating and developing section 70.

The coating and developing section 70 has two coating units 76 which coat the resist on wafers W, two developing units 77 which develop the exposed wafers, and two process unit towers 71 and 73 comprising a plurality of process units, which perform a hydrophobic process, a heating process, a cooling process, and so forth and are stacked one on another. Note that a process unit tower 75 indicated by a broken line can be provided, and when the process unit tower 75 is provided, it is movable along a guide rail 74.

One coating unit 76 and one developing unit 77 are stacked in two stages with the coating unit 76 underlying, and the other coating unit 76 and the other developing unit 77 are likewise stacked in two stages.

The coating and developing section 70 has a transfer mechanism 72 to transfer a wafer W, and the coating units 76, the developing units 77, and the process unit towers 71 and 73 are disposed around the transfer mechanism 72. The transfer mechanism 72 transfers a wafer W to and from the coating units 76, the developing units 77 and the individual process units in the process unit towers 71 and 73.

The transfer mechanism 72 is so constructed as to be, for example, elevatable up and down, movable forward and backward, and rotatable about the vertical axis by an unillustrated drive mechanism.

The interface section 80 has a periphery exposure apparatus 81 which exposes only the peripheral portion of a wafer W, a placing portion 83 on which the wafer W is temporarily placed, and a transfer mechanism 82 which transfers the wafer W. The transfer mechanism 82 transfers the wafer W to and from the periphery exposure apparatus 81, and transfers the wafer W between the coating and developing section 70 and the exposure apparatus 20. The placing portion 83 is constructed by stacking hold shelves for, for example, buffering in two stages.

The exposure apparatus 20 comprises a preprocess stage 91 on which a wafer W before exposure is to be placed, a vacuum chamber 95 where exposure is carried out, an electron gun 94 for exposure, a postprocess stage 92 on which a wafer W after exposure is to be placed, and a transfer arm 93 which transfers a wafer W between each stage 91, 92 and the vacuum chamber 95.

Transfer of a wafer W between the loading/unloading section 60 and the coating and developing section 70, and transfer of a wafer W between the coating and developing section 70 and the interface section 80 are carried out via transfer units respectively provided in the process unit towers 71 and 73.

The inline process for a wafer W in the pattern forming system 100 constructed as described above is executed as follows.

First, the wafer cassette CS where wafers W are retained are placed at the loading/unloading section 60 from outside, where a wafer W is taken out from inside the cassette CS by the transfer mechanism 61. The wafer W is transferred to the transfer unit of the process unit tower 71. The wafer W placed on the transfer unit is transferred to the hydrophobic process unit in the process unit tower 71 by the transfer mechanism 72, and a hydrophobic process is performed there. Next, the wafer W is transferred to the coating unit 76 where a resist liquid is coated to form a resist film. Thereafter, the wafer W undergoes prebaking in the heating unit in the process unit tower 71, is then transferred to the transfer unit of the process unit tower 73 by the transfer mechanism 72, and is then transferred to the interface section 80 by the transfer mechanism 82h.

the wafer W that has been sent to the interface section 80 is temporarily retained on the holding shelf of the placing portion 83 where it is set to the same temperature as the ambient temperature in the exposure apparatus 20, after which it is sent to the exposure apparatus 20.

After exposure by the exposure apparatus 20, the wafer W is returned again to the interface section 80, and only its peripheral portion is exposed by the periphery exposure apparatus 81, after which it is temporarily retained on the placing portion 83 when there is no space in the developing unit 77.

Thereafter, the wafer W is transferred to the transfer unit in the process unit tower 73 by the transfer mechanism 82, is transferred to the heating unit in the process unit tower 71 or 73 where it undergoes post-exposure baking, and it is further cooled by the cooling unit in the process unit tower 71 or 73. After cooling, the wafer W undergoes development in the developing unit 77. Thereafter, it undergoes post baking in the heating unit in the process unit tower 71 or 73, and is cooled by the cooling unit as needed. Thereafter, the wafer W is transferred to the transfer unit in the process unit tower 71 by the transfer mechanism 72, and is returned to the cassette CS at the loading/unloading section 60 by the transfer mechanism 61.

In the pattern forming system 100, the ambient temperatures of the coating and developing apparatus 1 and the exposure apparatus 20 are automatically adjusted, and the timing of transferring a wafer W or an object to be processed between the coating and developing apparatus 1 and the exposure apparatus 20 is adjusted to carry out the transfer smoothly.

That is, because the operations of the coating and developing apparatus and the exposure apparatus should be matched with each other, various settings on the internal software are done according to the software system of the exposure apparatus on, for example, the coating and developing apparatus side by a control system to be discussed later in the embodiment.

Figure 3:
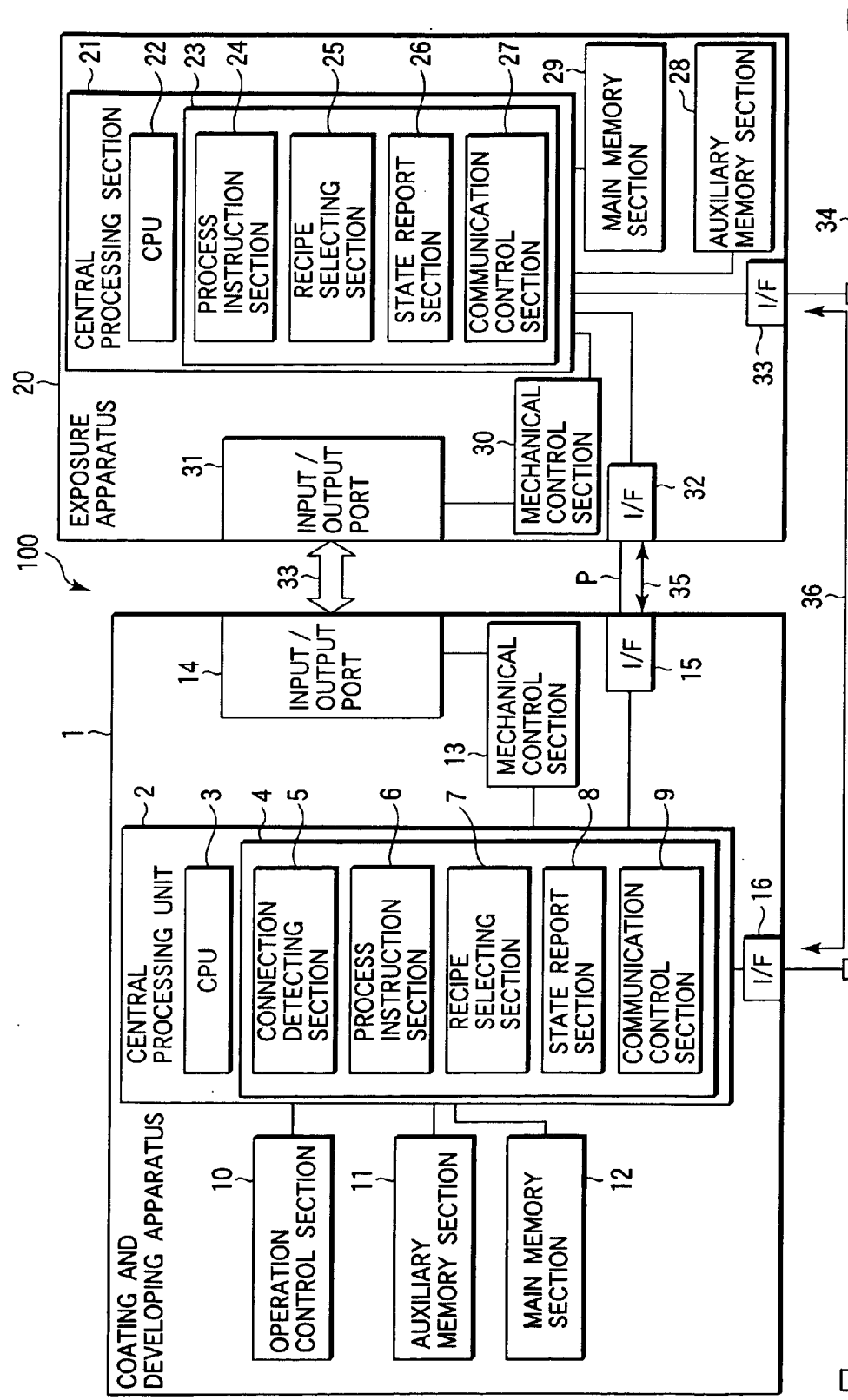
FIG. 3 is a block diagram exemplifying the internal structures of control systems of a coating and developing apparatus and an exposure apparatus, which constitute the pattern forming apparatus.

FIG. 3 is a block diagram exemplifying the structures of the control systems of the coating and developing apparatus 1 and the exposure apparatus 20, which constitute the pattern forming system 100 as shown in FIGS. 1 and 2.

As shown in FIG. 3, the coating and developing apparatus 1, which is a first processing apparatus and an inline connection setting apparatus (substrate processing apparatus), has a central processing unit 2 which performs the general internal control as the hardware of the control system and is the main portion of the operational control. This central processing unit 2 is connected with, as other control system hardware, an operation section 10, a non-volatile auxiliary memory section 11 as first memory means, a main memory section 12 which is second memory means and temporarily reads and writes information, a mechanical control section 13 which controls the mechanical operation, and communication interfaces 15 and 16 for executing information communication. An input/output port 14 for carrying a wafer in and out is connected to the mechanical control section 13.

The central processing unit 2 has a CPU 3 and an application specific IC 4, and the IC 4 comprises a connection detecting section 5, a process instruction section 6, a recipe selecting section 7, a state report section 8, and a communication control section 9.

The connection detecting section 5 has a function of detecting connection to the exposure apparatus 20 by a communication cable. The process instruction section 6 has functions, such as outputting an instruction to the coating and developing apparatus 1 based on a process instruction from the host computer 45, e.g., a process start instruction or a wafer lot change instruction.

The recipe selecting section 7 has a function of selecting a corresponding process recipe from a recipe group stored in the auxiliary memory section 11 based on an identification code sent from the host computer 45. The process recipe is program software which processes a wafer or an object to be processed, defines multifarious conditions, such as the types of the resist liquid and the developing liquid to be used in the coating and developing apparatus 1, and the process time, and plural types of recipes are prepared by combinations of the conditions, thereby forming a recipe group.

The state report section 8 has a function of reporting a process status report and a process result report, or information on the coating and developing apparatus 1, such as failure information, temporarily stored in the main memory section 12, to the host computer 45 and the exposure apparatus 20.

The communication control section 9 has a function of performing communication control with respect to the exposure apparatus 20 and the host computer 45 via the communication interfaces 15 and 16.

Meanwhile, the exposure apparatus 20 (substrate processing apparatus), which is a second processing apparatus and a partner apparatus of the coating and developing apparatus 1, has a central processing unit 21 which is the main portion of the operational control of the exposure apparatus 20 as the hardware of the control system. This central processing unit 21 is connected with, as other control system hardware, a non-volatile auxiliary memory section 28, a main memory section 29 which temporarily reads and writes information, a mechanical control section 30 which controls the mechanical operation in the exposure apparatus 20, and communication interfaces 32 and 33' for executing information communication. An input/output port 31 for carrying a wafer in and out is connected to the mechanical control section 30.

The central processing unit 21 has a CPU 22 and an application specific IC 23. The IC 23 comprises a process instruction section 24, a recipe selecting section 25, a state report section 26, and a communication control section 27.

The process instruction section 24 has a function of outputting an instruction to the exposure apparatus 20 based on a process instruction from the host computer 45.

The recipe selecting section 25 has a function of selecting a corresponding process recipe from a recipe group stored in the auxiliary memory section 28 based on an identification code sent from the host computer 45. Note that the process recipe defines, for example, the type of a reticle, the exposure time, and the exposure amount.

The state report section 26 has a function of reporting a process status report, or information on the exposure apparatus 20, such as failure information, stored in the main memory section 29, to the host computer 45 and the coating and developing apparatus 1.

The communication control section 27 has a function of performing communication control with respect to the coating and developing apparatus 1 and the host computer 45 via the communication interfaces 32 and 33.

The communication interface 15 of the coating and developing apparatus 1 and the communication interface 32 of the exposure apparatus 20 are connected to by an 8-pin parallel cable P, thus forming the communication path 35. As mentioned above, the coating and developing apparatus 1 and the exposure apparatus 20 are connected to the respective LAN cables 34, and are connected via the communication interfaces 16 and 33, respectively, thus forming a communication path 36 on the LAN.

The thus-constructed pattern forming system 100 operates as following at the start of activation (at the power ON time).

First, when the coating and developing apparatus 1 and the exposure apparatus 20 are both powered on, the connection detecting section 5 in the central processing unit 2 of the coating and developing apparatus 1 detects hardware connection to the exposure apparatus 20. That is, it detects that the communication interface 15 of the coating and developing apparatus 1 is connected to the communication interface 32 of the exposure apparatus 20 in a 1-to-1 manner by the parallel cable P.

Next, the coating and developing apparatus 1 automatically does software inline connection setting with respect to the exposure apparatus 20 according to information exchange via the communication path 36 on the LAN. The software connection setting is the feature of the invention, and will be elaborated later.

After connection setting for the coating and developing apparatus 1 and the exposure apparatus 20 is done, the recipe selecting section 7 of the coating and developing apparatus 1 selects a corresponding process recipe from a process recipe group stored in the auxiliary memory section 11 according to an instruction from the host computer 45 (see FIG. 1).

The selected process recipe is temporarily loaded into the main memory section 12 which can write and read information at a high speed. The process instruction section 6 instructs the mechanical control section 13, etc. to execute a process on a wafer or an object to be processed according to the process recipe in the main memory section 12 in cooperation with the exposure apparatus 20.

In the exposure apparatus 20, likewise, the recipe selecting section 25 selects a corresponding process recipe from the process recipe group stored in the auxiliary memory section 28 according to an instruction from the host computer 45. The selected process recipe is temporarily read into the main memory section 29 which can write and read information at a high speed. The process instruction section 24 instructs the mechanical control section 30, etc. to execute an exposure process on a wafer or an object to be processed according to the process recipe in the main memory section 29 in cooperation with the coating and developing apparatus 1.

Subsequently, software inline connection setting for the coating and developing apparatus 1 with respect to the exposure apparatus 20 will be described.

Figure 4:
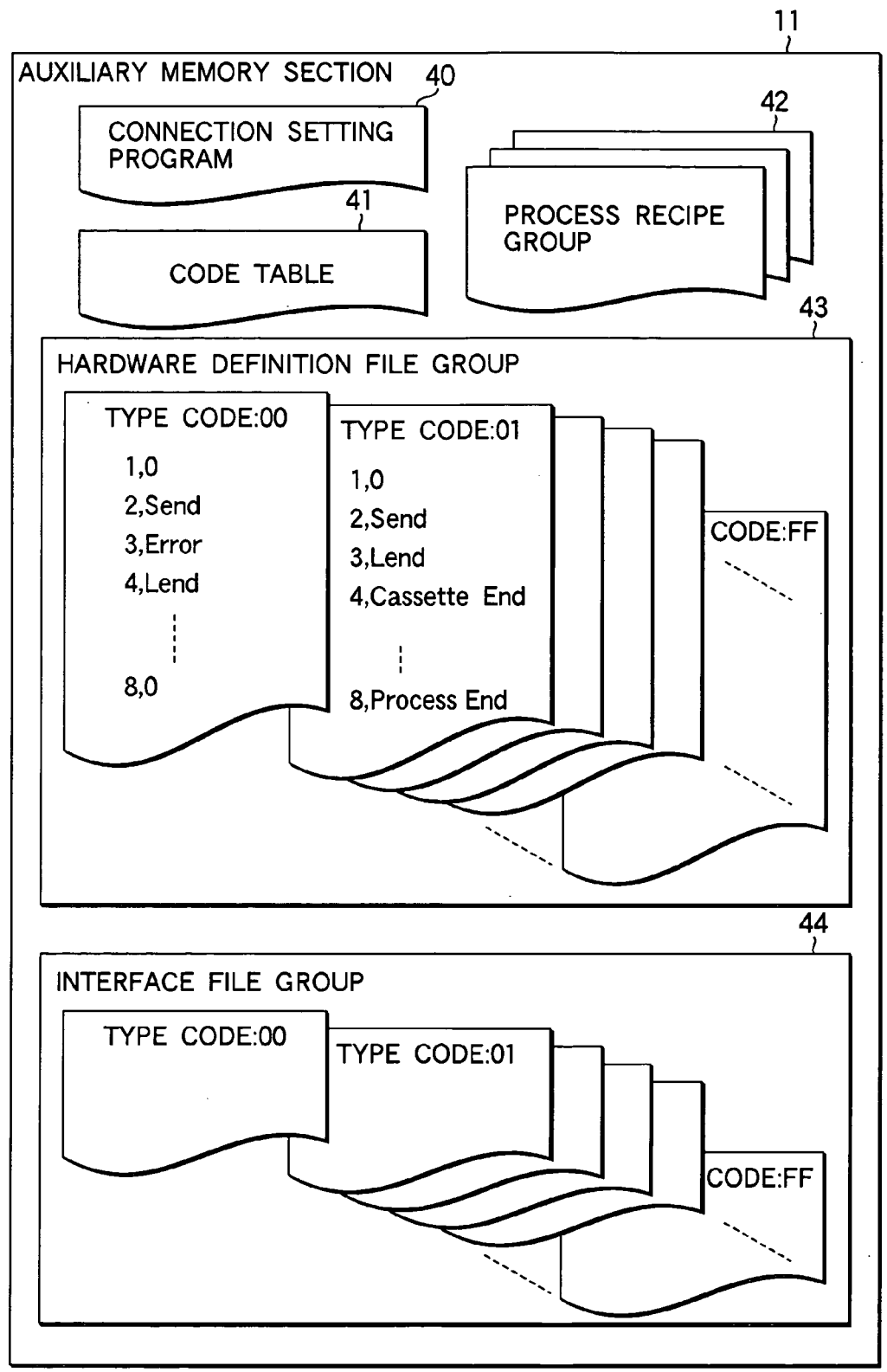
FIG. 4 is a diagram showing partial memory elements of an auxiliary memory section of the coating and developing apparatus.
Figure 5:
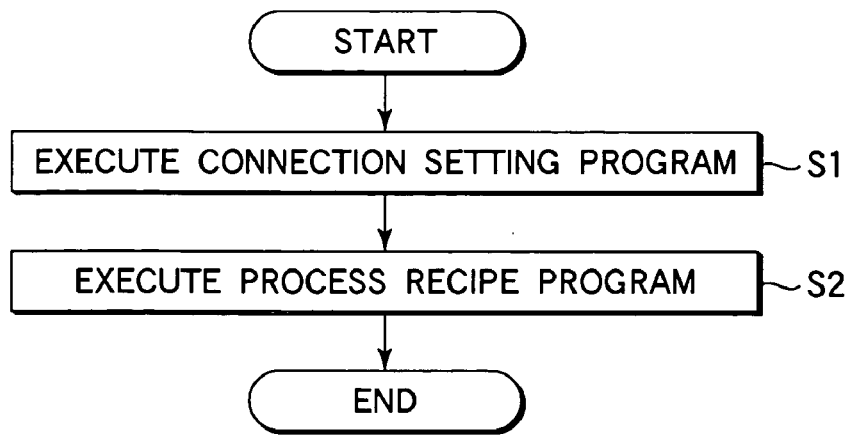
FIG. 5 is a diagram illustrating the execution flow of a software program in the coating and developing apparatus.
Figure 6:
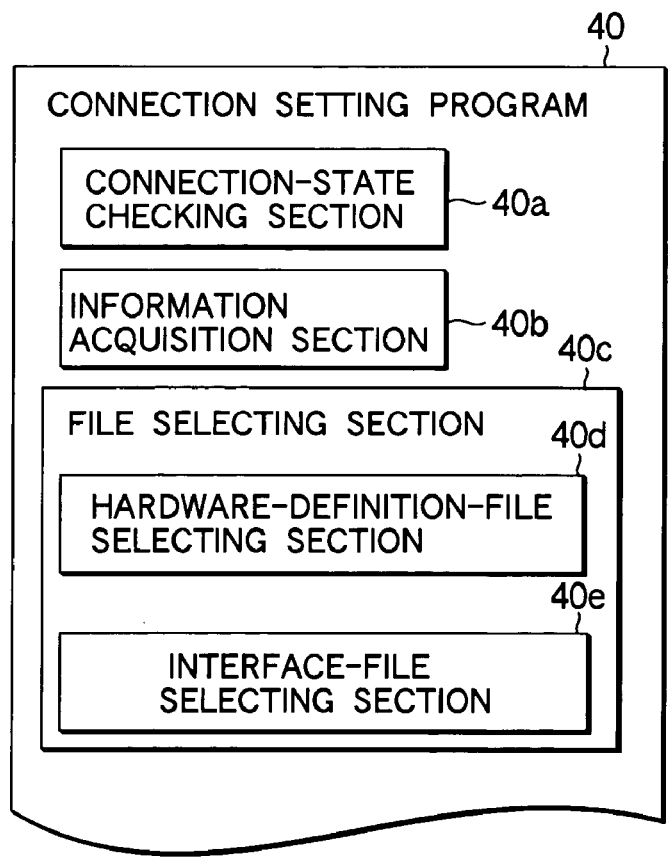
FIG. 6 is a diagram showing configuration modules of a connection setting program.
Figure 9:
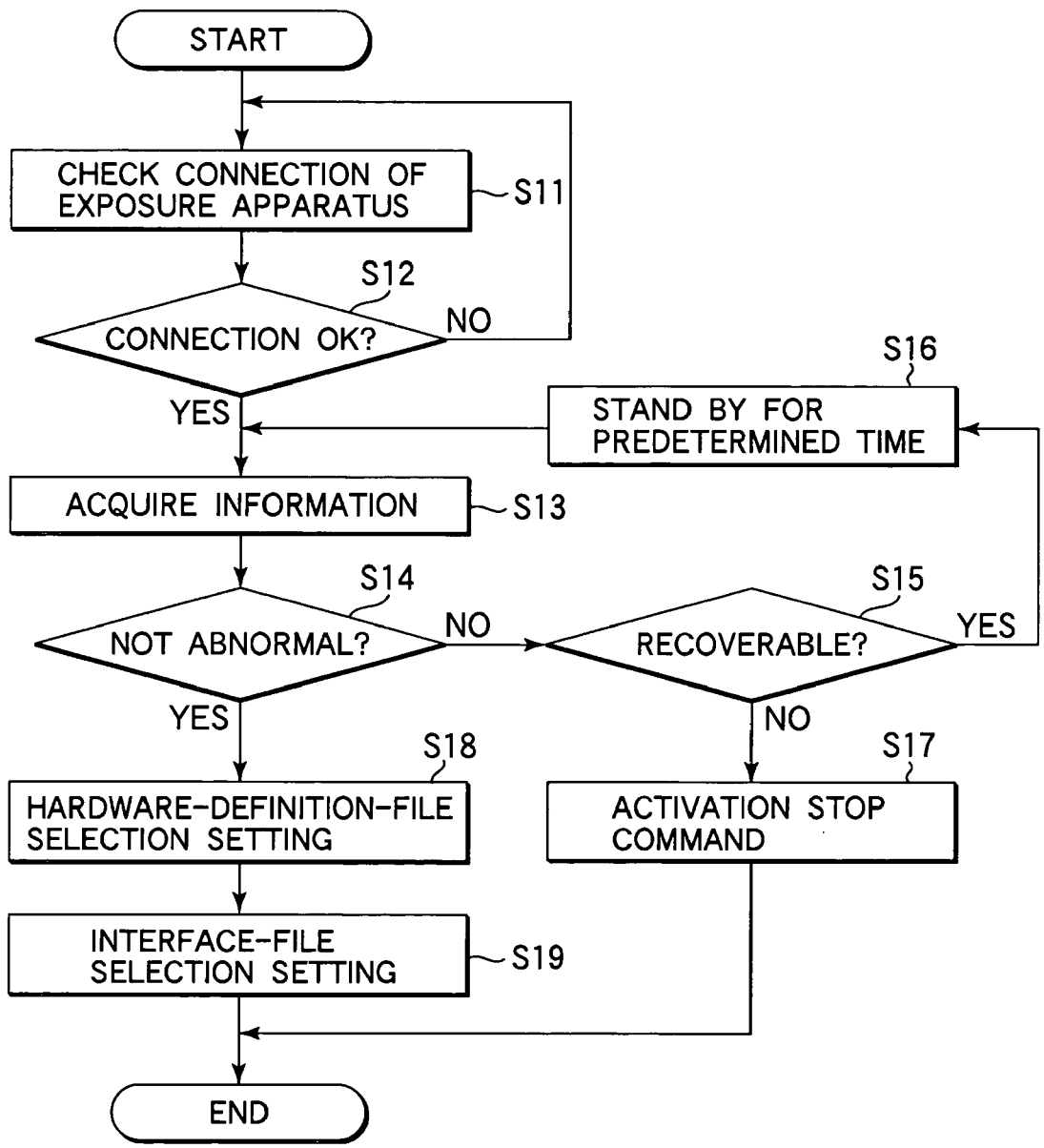
FIG. 9 is a diagram illustrating the process flow of the connection setting program.

FIG. 4 shows partial memory elements of the auxiliary memory section 11 of the coating and developing apparatus 1. FIG. 5 shows the execution flow of a software program in the coating and developing apparatus 1, and FIG. 6 shows configuration modules of a connection setting program. FIG. 7 shows an example of a code table which is stored as data in the auxiliary memory section 11, FIGS. 8A and 8B respectively show examples of assignment of connector pins in exposure apparatuses of a company A and a company B, and FIG. 9 shows the process flow of the connection setting program.

As shown in FIG. 4, at least a connection setting program 40, a code table 41, a process recipe group 42, a hardware definition file group 43, and an interface file group 44 are stored in the auxiliary memory section 11 of the coating and developing apparatus 1.

The connection setting program 40 is a program for automatically doing software connection setting for the coating and developing apparatus 1 with respect to the exposure apparatus 20. The process recipe group 42 comprises a plurality of process recipes.

The code table 41 shows combinations of maker names, models and software versions in association with type codes, as shown in FIG. 7.

The hardware definition file group 43 comprises plural types of files which describe information on the assignment of connector pins of the communication cable P (see FIG. 3) in association with the type codes and are used in a selected process recipe.

As the connector-pins assignment information, as exemplified in FIGS. 8A and 8B, signal names and functions assigned to the pin numbers of the "connector pins" of the communication cable are stored in the hardware definition file group 43 for each of the makers of the partner apparatuses, such as the maker A and the maker B.

The interface file group 44 comprises plural types of interface files which are associated with the type codes and are used in the program in a selected process recipe. The interface file is a software file which is the interface portion between a hardware definition file and a process recipe, which are used in the program in the selected process recipe.

In this inline connection setting, first, the coating and developing apparatus 1 executes the connection setting program 40 to smoothly perform an inline process with the connected exposure apparatus 20 as shown in FIG. 5 (step S1). This is achieved as the connection setting program 40 stored in the auxiliary memory section 11 is activated after the coating and developing apparatus 1 and the exposure apparatus 20 are powered on.

The execution of the connection setting program 40 provides matching between the coating and developing apparatus 1 and the exposure apparatus 20, after which the process recipe designated and selected by the host computer 45 is selected by the recipe selecting section 7, and the selected recipe program is executed to perform a predetermined process on a wafer or an object to be processed (step S2).

The above-described connection setting program 40 will be described in more detail. The connection setting program 40, as shown in FIG. 6, includes at least a connection-state checking section 40a, an information acquisition section 40b and a file selecting section 40c, each of which is served as a sub-program. The file selecting section 40c comprises a hardware-definition-file selecting section 40d and an interface-file selecting section 40e.

The connection-state checking section 40a has a function (program) of checking whether if communication with the exposure apparatus 20 is possible via the communication path 36 formed on the LAN or not, and establishes a communicatable state when it is communicatable.

The information acquisition section 40b has a function (program) of acquiring profile information of the exposure apparatus 20 from the state report section 26, etc. of the exposure apparatus 20 via the communication path 36. The profile information includes information on the maker, the model, the software version and so forth of the exposure apparatus 20, and information on whether there is an abnormality in the exposure apparatus 20 or not.

The hardware-definition-file selecting section 40d has a function (program) of finding a corresponding type code from the profile information acquired by the information acquisition section 40b, and selecting a hardware definition file corresponding to that type code from the hardware definition file group 43 stored in the auxiliary memory section 11.

The interface-file selecting section 40e has a function (program) of selecting an interface file corresponding to the type code from the interface file group 44 stored in the auxiliary memory section 11.

Next, using FIG. 9, the operation at the time of executing the connection setting program 40 will be explained. Note that the information communication which is carried out by the coating and developing apparatus 1 and the exposure apparatus 20 using the communication path 36, formed on the LAN, is to be carried out according to the commonly defined protocol.

First, the coating and developing apparatus 1 and the exposure apparatus 20 are powered on, and, when the connection detecting section 5 of the central processing unit 2 detects the connection to the exposure apparatus 20, the connection setting program 40 is loaded into the main memory section 12 which can write and read data at a high speed, and is activated.

After the activation of the program, the connection-state checking section 40a issues a query signal to the exposure apparatus 20 via the communication path 36 formed on the LAN (step S11). In response, when a normal response signal is returned from the exposure apparatus 20, it is determined that the connection is properly established (step S12), and the flow proceeds to the next step. In a case where there is no normal response signal from the exposure apparatus 20 (step S12), the query to the exposure apparatus 20 is repeated again, and the coating and developing apparatus 1 is in a standby state while there is no normal response.

When the connection with the exposure apparatus 20 is confirmed, the information acquisition section 40b issues a profile-information request command to the exposure apparatus 20 (step S13). Here, the exposure apparatus 20 returns, as the profile information, information such as the maker name, the model, and the software version of the exposure apparatus 20, and information on whether or not there is an abnormality in the exposure apparatus 20, etc. to the information acquisition section 40b via the communication path 36 on the LAN.

When it is determined from those profile information that the exposure apparatus 20 is not abnormal (step S14), the hardware-definition-file selection setting is carried out (step S18).

In the hardware-definition-file selection setting, the hardware-definition-file selecting section 40d uses the code table 41 to find a corresponding type code from the profile information acquired by the information acquisition section 40b at the step S13, and selects a hardware definition file corresponding to the type code from the hardware definition file group 43 stored in the auxiliary memory section 11. In practice, the read address of the hardware definition file used during the execution of the process recipe is determined.

Next, following the hardware-definition-file selection setting, the selection setting for an interface file is carried out (step S19). In the selection setting for an interface file, the interface-file selecting section 40e selects an interface file, corresponding to the type code and the hardware definition file, from the interface file group 44 stored in the auxiliary memory section 11. In Practice, the read address of the interface file used during the execution of the process recipe is determined.

When it is determined at the step S14 that the exposure apparatus 20 is in an abnormal state, on the other hand, it is further determined from this report whether or not the exposure apparatus 20 is recoverable (step S15). When it is determined that the exposure apparatus 20 is not recoverable, an activation stop instruction is issued to the process instruction section 6 (step S17), the activation of the coating and developing apparatus 1 is stopped (powered OFF), and the process is terminated.

When it is determined at the step S15 that the exposure apparatus 20 is recoverable, after standing by for a predetermined time (step S16), the flow returns to step S13 again to request acquisition of information on the exposure apparatus 20.

As mentioned above, the selected process recipe is executed after the connection setting program is terminated. In this case, while the process recipe program, the selected hardware definition file, and the selected interface file are loaded into the main memory section 12, the selected process recipe is executed. At this time, the process recipe program is executed while using the selected hardware definition file and interface file.

During the execution of the process recipe program, by regularly requesting transfer the profile information from the exposure apparatus 20 (step S13 in FIG. 9), the recent state of the exposure apparatus may be grasped, and, if there is any change or abnormality, adequate measures, such as stopping the activation (power OFF), may be carried out.

As apparent from the above, in one embodiment according to the invention, as the profile information is acquired from the inline-connected partner apparatus, and the setting in the inline connection is automatically carried out in association with the profile information, it is possible to automatically cope with a case where the partner apparatus is changed. That is, artificial mistakes can be reduced, thereby preventing a reduction in yield.

When an abnormality occurs in the inline-connected partner apparatus, the abnormality information is received from the partner apparatus and the adequate measures can be taken, thereby preventing an trouble or the like.

As a measure against a case where an abnormality occurs in the coating and developing apparatus 1 or the partner apparatus during activation, the program for the trouble recovery (recovery process), and a scenario (procedure) file according to the type of the abnormality and the type of the partner apparatus may be prepared in the auxiliary memory section 11.

Accordingly, the program for the trouble recovery automatically operates when an abnormality occurs, and the proper recovery process can be executed by referring to the scenario file. In this case, it is desirable that the same scenario file should be prepared in both apparatuses beforehand to synchronize the operations of the coating and developing apparatus 1 and the partner apparatus.

In the embodiment described above, the auxiliary memory section 11 in the coating and developing apparatus 1 is one nonvolatile memory section, but it may be divided into plural sections. The method including the process by the connection setting program 40, stored in the auxiliary memory section 11, may be realized by hardware. Although the coating and developing apparatus 1 is the first processing apparatus and the inline connection setting apparatus in the embodiment described above, the exposure apparatus 20 may be the first processing apparatus and the inline connection setting apparatus. Further, the inline-connected apparatuses are not limited to the coating and developing apparatus and the exposure apparatus, the inline connection setting method and the apparatus of the present invention can be adapted to other apparatuses as long as they are inline-connected apparatuses.

INDUSTRIAL APPLICABILITY

As is apparent from the above explanations, according to the invention, when the inline-connected partner apparatus body or the internal software of the partner apparatus is changed, the setting work for the internal software corresponding to the connected partner apparatus can be automatically carried out. When an abnormality occurs in the connected partner apparatus, the adequate measures can be taken automatically.

The invention is not limited to an inline process for a substrate like a wafer, but can be well applied to an inline process for a substrate or the like in a flat panel display, such as a liquid crystal display or a plasma display.

The invention claimed is:

1. An inline connection setting method for automatically setting connection between apparatuses which perform an inline process on an object to be processed, comprising steps of:
   causing a first processing apparatus to request a second processing apparatus, connected inline to said first processing apparatus, to transfer profile information which is information relating to said second processing apparatus;
   causing said first processing apparatus to receive said profile information from said second processing apparatus; and
   causing said first processing apparatus to select a software file to be used in said first processing apparatus, in association with said profile information.

2. The inline connection setting method according to claim 1, wherein said first processing apparatus receives said profile information by directly communicating with said second processing apparatus via a communication path formed in an LAN.

3. The inline connection setting method according to claim 1, wherein said profile information includes at least maker information and model information of said second processing apparatus, and version information of software file to be used in said first processing apparatus.

4. The inline connection setting method according to claim 1, wherein said profile information includes information on whether said second processing apparatus is in a normal state or not.

5. The inline connection setting method according to claim 1, wherein said first processing apparatus is connected to said second processing apparatus in a 1-to-1 manner by a communication cable, and comprises plural types of hardware definition files which are information on assignment of connector pins of said communication cable, and
   selects a hardware definition file to be used in said first processing apparatus from said plural types of hardware definition files in association with said profile information.

6. The inline connection setting method according to claim 5, wherein said first processing apparatus further comprising software for processing the object to be processed, and plural types of interface files, and
   selects an interface file to be used in said first processing apparatus from said plural types of interface files in association with said selected hardware definition file.

7. The inline connection setting method according to claim 1, wherein said first processing apparatus requests said second processing apparatus to transfer said profile information every given time.

8. An inline connection setting apparatus for automatically setting connection of a second processing apparatus to a first processing apparatus which performs an inline process on an object to be processed, comprising:
   first memory means having a connection-state checking section which checks connection for information communication with said second processing apparatus, connected inline to said first processing apparatus, an information acquisition section which requests said second processing apparatus to transfer profile information relating to said second processing apparatus and receives said profile information, and a file selecting section which selects a software file to be used in association with said profile information; and
   control means for executing a program stored in said first memory means.

9. The inline connection setting apparatus according to claim 8, wherein said first processing apparatus is connected to said second processing apparatus, connected inline thereto, in a 1-to-1 manner by a communication cable, and
   said first memory means stores plural types of hardware definition files which are information on assignment of connector pins of said communication cable.

10. The inline connection setting apparatus according to claim 9, wherein said file selecting section has a hardware-definition-file selecting section, and
    said hardware-definition-file selecting section selects a hardware definition file to be used from said plural types of hardware definition files.

11. The inline connection setting apparatus according to claim 8, wherein said first memory means stores software for processing the object to be processed, said plural types of hardware definition files, and plural types of interface files.

12. The inline connection setting apparatus according to claim 11, wherein said file selecting section has a hardware-definition-file selecting section and an interface-file selecting section, said hardware-definition-file selecting section selects a hardware definition file to be used from said plural types of hardware definition files, and said interface-file selecting section selects an interface file to be used from said plural types of interface files.

13. The inline connection setting apparatus according to claim 8, wherein said information acquisition section receives said profile information by directly communicating with said inline-connected second processing apparatus via a communication path formed in an LAN.

14. The inline connection setting apparatus according to claim 8, wherein said profile information includes at least maker information and model information of said second processing apparatus, and version information of software file to be used in said first processing apparatus, and said inline connection setting apparatus further comprises second memory means for storing said profile information received.

15. The inline connection setting apparatus according to claim 8, wherein said profile information includes information on whether said second processing apparatus is in a normal state or not.

16. The inline connection setting apparatus according to claim 8, wherein said first processing apparatus is a resist coating and developing apparatus, and said second processing apparatus is an exposure apparatus.

17. A substrate processing apparatus which performs an inline process on a substrate in cooperation with a partner apparatus, comprising:

a processing section which performs an inline process on the substrate;

a substrate transfer mechanism which transfers the substrate between said processing section and said partner apparatus;

a first communication interface which performs information communication with the partner apparatus for performing said inline process on the substrate;

a second communication interface which communicates software information with the partner apparatus;

information acquisition means which acquires profile information relating said partner apparatus from the partner apparatus via the second communication interface;

software-file memory means which stores a plurality of software files for controlling an operation of said substrate said substrate processing apparatus; and file selecting means which selects, from said software-file memory means, a software file for controlling the operation of the said substrate processing.

18. The substrate processing apparatus according to claim 17, wherein said second communication interface is connected by an LAN to an interface corresponding to said partner apparatus.

19. The substrate processing apparatus according to claim 17, wherein said profile information includes at least maker information and model information of said partner substrate processing apparatus, and version information of software file to be used in said partner substrate processing apparatus.

20. The substrate processing apparatus according to claim 17, wherein said profile information includes information on whether said partner substrate processing apparatus is in a normal state or not.

21. The substrate processing apparatus according to claim 17, wherein said first communication interface is connected to an associated interface of said partner apparatus in a 1-to-1 manner by a communication cable, and said software-file memory means has plural types of hardware definition files which are information on assignment of connector pins of said communication cable, and said file selecting means selects a hardware definition file to be used in said first processing apparatus from said plural types of hardware definition files in association with said profile information.

22. The substrate processing apparatus according to claim 21, wherein said software-file memory means further has software for processing the substrate, and plural types of interface files, and said file selecting means selects an interface file to be used in the substrate processing apparatus from said plural types of interface files in association with said selected hardware definition file.

23. The substrate processing apparatus according to claim 17, wherein said information acquisition means requests said partner substrate processing apparatus to transfer said profile information every given time.

24. The substrate processing apparatus according to claim 17, wherein the substrate processing apparatus is a resist coating and developing apparatus, and said partner apparatus is an exposure apparatus.

25. A substrate processing system comprising a first processing apparatus which performs an inline process on an object to be processed, and a second processing apparatus, wherein said first processing apparatus comprising a connection setting section having:

first memory means having a connection-state checking section which checks connection for information communication with said second processing apparatus, connected inline, an information acquisition section which requests said second processing apparatus to transfer profile information relating to said second processing apparatus and receives said profile information, and a file selecting section which selects a software file to be used in association with said profile information; and control means for executing a program stored in said first memory means.

26. The substrate processing system according to claim 25, wherein said first processing apparatus is connected to said second processing apparatus, connected inline thereto, in a 1-to-1 manner by a communication cable, and said first memory means stores plural types of hardware definition files which are information on assignment of connector pins of said communication cable.

27. The substrate processing system according to claim 26, wherein said file selecting section has a hardware-definition-file selecting section, and said hardware-definition-file selecting section selects a hardware definition file to be used from said plural types of hardware definition files.

28. The substrate processing system according to claim 25, wherein said first memory means stores software for processing the object to be processed, said plural types of hardware definition files, and plural types of interface files.

29. The substrate processing system according to claim 28, wherein said file selecting section has a hardware-definition-file selecting section and an interface-file selecting section, said hardware-definition-file selecting section selects a hardware definition file to be used from said plural types of hardware definition files, and said interface-file selecting section selects an interface file to be used from said plural types of interface files.

30. The substrate processing system according to claim 25, wherein said information acquisition section receives said profile information by directly communicating with said inline-connected second processing apparatus via a communication path formed in an LAN.

31. The substrate processing system according to claim 25, wherein said profile information includes at least maker information and model information of said second processing apparatus, and version information of software file to be used in said first processing apparatus, and said connection setting section comprises second memory means for storing said profile information received.

32. The substrate processing system according to claim 25, wherein said profile information includes information on whether said second processing apparatus is in a normal state or not.

33. The substrate processing system according to claim 25, wherein said first processing apparatus is a resist coating and developing apparatus, and said second processing apparatus is an exposure apparatus.

* * * * *